United States Patent [19]
Prall et al.

[11] Patent Number: 6,080,675
[45] Date of Patent: *Jun. 27, 2000

[54] METHOD FOR CLEANING WASTE MATTER FROM THE BACKSIDE OF A SEMICONDUCTOR WAFER SUBSTRATE

[75] Inventors: Kirk Prall; Guy Blalock, both of Boise, Id.

[73] Assignee: Micron Technology, Inc., Boise, Id.

[ * ] Notice: This patent is subject to a terminal disclaimer.

[21] Appl. No.: 09/344,435

[22] Filed: Jun. 25, 1999

Related U.S. Application Data

[63] Continuation of application No. 08/915,193, Aug. 20, 1997, Pat. No. 5,958,796, which is a continuation of application No. 08/643,484, May 6, 1996, Pat. No. 5,716,873.

[51] Int. Cl.$^7$ ..................... H01L 21/311; H01L 21/3213
[52] U.S. Cl. ........................... 438/694; 438/906; 438/928
[58] Field of Search ..................................... 438/694, 906, 438/928

[56] References Cited

U.S. PATENT DOCUMENTS

| | | | |
|---|---|---|---|
| 5,223,734 | 6/1993 | Lowrey et al. | 257/401 |
| 5,461,002 | 10/1995 | Safir | 438/558 |
| 5,601,732 | 2/1997 | Yoshida | 216/36 |
| 5,716,873 | 2/1998 | Prall et al. | 438/669 |
| 5,958,796 | 9/1999 | Prall et al. | 438/694 |

*Primary Examiner*—Benjamin L. Utech
*Assistant Examiner*—Donald L. Champagne
*Attorney, Agent, or Firm*—Perkins Coie LLP

[57] ABSTRACT

A method for manufacturing a semiconductor device on a wafer that has a substrate with a front side and a backside, and an accumulation of waste matter on the backside of the substrate. In a method of the invention, a covet layer is deposited over the front side in a normal coating step of a process for fabricating a component on the wafer. The cover layer provides material used in the process for fabricating the component on the front side of the wafer and creates a barrier over the front side. The waste matter is removed from the backside of the wafer by etching the waste matter from the backside of the wafer with a suitable etchant, or by planarizing the backside of the wafer with a chemical-mechanical planarization ("CMP") process. During the removal step, the cover layer protects the front side and any device features on the front side from being damaged while the waste matter is removed from the backside of the wafer. Since the cover layer is deposited in a normal coating step of the process for fabricating a component on the wafer, it is deposited irrespective of whether the waste matter is removed from the wafer.

18 Claims, 4 Drawing Sheets

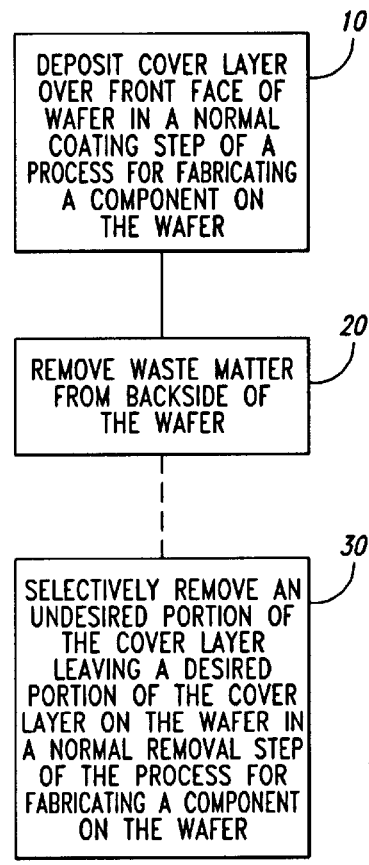
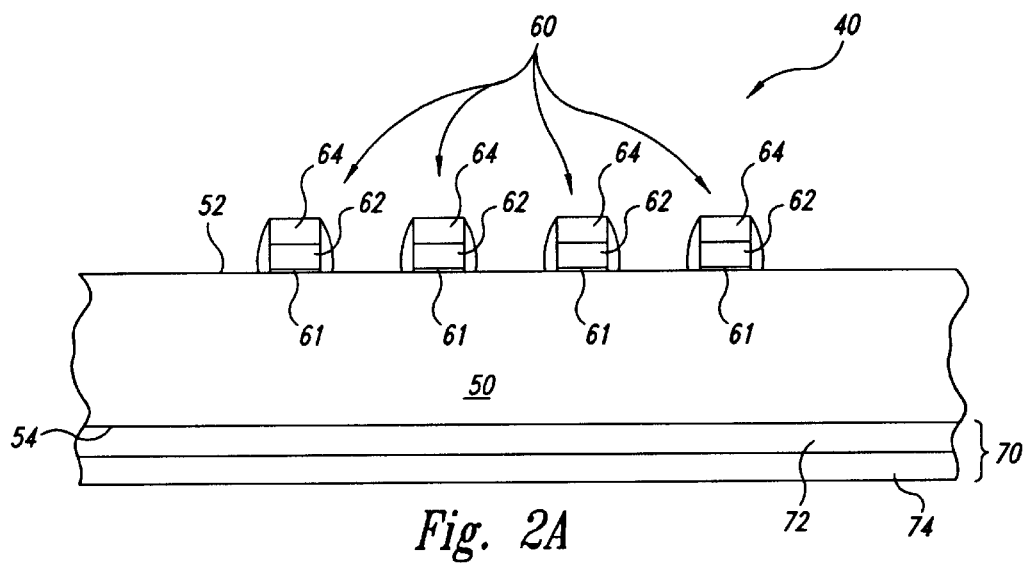
Fig. 1
Fig. 2A

METHOD FOR CLEANING WASTE MATTER FROM THE BACKSIDE OF A SEMICONDUCTOR WAFER SUBSTRATE

CROSS-REFERENCE TO RELATED APPLICATION

This application is a continuation of U.S. patent application Ser. No. 08/915,193, filed Aug. 20, 1997, which is a continuation of U.S. patent application Ser. No. 08/643,484, filed May 6, 1996, and issued on Feb. 10, 1998 as U.S. Pat. No. 5,716,873.

TECHNICAL FIELD

The present invention relates to a method for cleaning undesirable waste matter from the backside of a semiconductor wafer substrate.

BACKGROUND OF THE INVENTION

Microelectronic devices are manufactured on a substrate made from silicon or other suitable semiconductor materials. In typical fabrication processes, several hundred microelectronic devices are fabricated on a single wafer at the same time. Each microelectronic device has numerous electrical circuits formed from layers of device features that are integrated together on the front side of the wafer substrate. The integrated circuits are formed by masking, doping, depositing, and selectively removing materials in very precise patterns on the front side of the wafer substrate. During the fabrication of the integrated circuits on the front side of the wafer substrate, undesirable waste materials often accumulate on the backside of the substrate.

In the highly competitive semiconductor industry, it is desirable to maximize the throughput of finished microelectronic devices. Current semiconductor manufacturing processes are expensive because, among other reasons, the device features of the integrated circuits may be as small as 0.35 to 0.50 $\mu$m, and many of the process steps are performed in extremely clean environments. Therefore, to reduce the unit cost of making each microelectronic device, it is desirable to maximize the number of finished dies produced in a period of time.

One factor influencing the throughput of semiconductor manufacturing is that the waste matter on the backside of the wafer should be removed to prevent the wafers from warping and to provide a clean surface for extrinsic gettering of the wafer substrate. The waste matter may consist of several layers of material used to form some of the components of the circuits on the front side of the substrate. Typically, the waste matter is made from layers of polysilicon, tungsten, aluminum, metal oxides, borophosphate silicon glass ("BPSG"), or tetraethyl orthosilicate ("TEOS"). The waste matter on the backside of the wafer may cause the silicon wafer to warp because internal stresses in the lattice structures of the waste matter tend to bend the thin, flexible silicon wafer. Additionally, because the materials on the backside of the wafer have different rates of thermal expansion than silicon, additional stresses act on the wafer substrate as the wafer is heated and cooled throughout the fabrication process. Thus, to prevent the wafer substrate from warping and to provide a clean backside for other processes, it is desirable to remove the waste matter from the backside of the wafer.

One problem with conventional fabrication processes is that removing the waste matter from the backside of a wafer reduces the throughput and increases the material costs of the finished microelectronic devices. In conventional fabrication processes, waste matter is removed from the backside of the wafer by: (1) depositing a sacrificial cover layer made from a resist material over the front side of the wafer to protect the circuitry on the front side from the etchants used to remove the waste matter; (2) etching the waste matter from the backside of the wafer using suitable etchants that remove the particular materials of the waste matter; and (3) removing all of the sacrificial resist layer from the front side of the wafer. Conventional waste matter removal methods require additional process steps and time because the sacrificial resist layer must be deposited over on the front side of the wafer and then completely removed from the wafer. This method wastes time and material because the sacrificial resist layer is a temporary layer formed on the wafer only for the purpose of removing material from the backside of the wafer. Since the sacrificial resist layer is not used for any other purpose, the time and materials used to form and remove the sacrificial resist layer are lost expenses once the backside of the wafer is clean. Thus, conventional methods for removing the waste matter from the backside of the wafer reduce the throughput and increase the material cost of manufacturing microelectronic devices.

In light of the problems with conventional methods for removing waste matter from the backside of a wafer, it would be desirable to develop a method for removing waste matter from the backside of the wafer that does not markedly increase the time and materials required to fabricate microelectronic devices on semiconductor wafers.

SUMMARY OF THE INVENTION

The inventive method is a method for manufacturing a semiconductor device on a wafer that has a substrate with a front side and a backside, and an accumulation of waste matter on the backside of the substrate. In one embodiment of the method of the invention, a cover layer is deposited over the front side of the wafer in a normal coating step of a process for fabricating a component on the wafer. The cover layer provides material used in the process for fabricating the component on the front side of the wafer and creates a barrier over the front side. The waste matter is preferably removed from the backside of the wafer by etching the waste matter from the backside of the wafer with a suitable etchant, or by planarizing the backside of the wafer with a chemical-mechanical planarization ("CMP") process. During the removal step, the cover layer protects the front side and any device features on the front side from being damaged while the waste matter is removed from the backside of the wafer. Since the cover layer is deposited in a normal coating step of the process for fabricating a component on the wafer, it is deposited irrespective of whether the waste matter is removed from the wafer.

In another embodiment of the method of the invention, a portion of the cover layer deposited over the front side of the wafer is used to form a permanent component of the microelectronic device. After the waste matter is removed from the backside of the wafer, a permanent device component is formed from a desired portion of the cover layer. The permanent device component is preferably formed by etching or planarizing an undesired portion of the cover layer from the wafer to leave the desired portion of the cover layer on the front side of the substrate.

BRIEF DESCRIPTION OF THE DRAWINGS

FIG. 1 is a flow diagram of a method in accordance with the invention.

FIG. 2A is a partial schematic cross-sectional view of a semiconductor wafer structure at one point of the method illustrated in FIG. 1.

DETAILED DESCRIPTION OF THE INVENTION

Figure 2B:
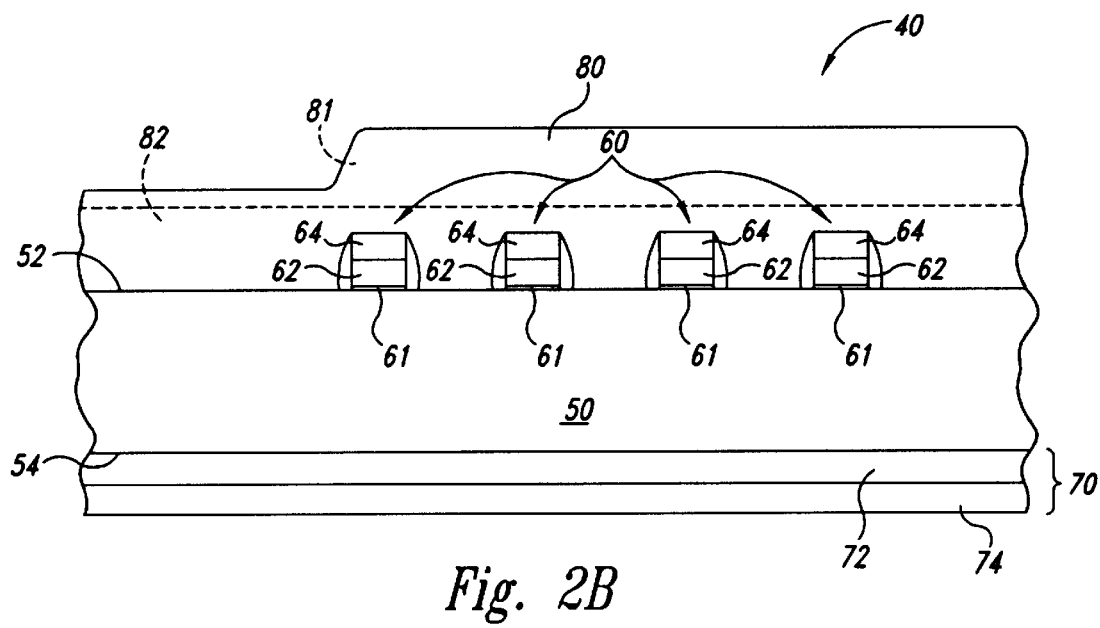
FIG. 2B is a partial schematic cross-sectional view of the semiconductor wafer structure of FIG. 2A at another point of the method of FIG. 1.

The present invention provides a method to clean waste matter from the backside of a semiconductor wafer substrate that reduces the number of process steps and the waste of materials compared to conventional waste matter removal methods. One aspect of the invention is to provide a cover layer on the wafer that is deposited in a normal processing step of a process for fabricating a component on the wafer. The cover layer is deposited irrespective of whether waste matter is removed from the wafer; consequently, the cover layer is not a sacrificial layer dedicated solely to protecting the front side of the wafer while the waste matter is removed from the backside of the wafer. By forming the cover layer in the normal coating step for fabricating a component on the wafer, the method eliminates the deposition and removal steps of a separate, temporary resist material used only to protect the front side of the wafer while the waste matter is removed from the backside of the wafer. Compared to conventional waste matter cleaning methods, therefore, the present invention reduces the number of process steps and the costs associated with the resist materials. FIGS. 1–4C, in which like reference numbers refer to like parts throughout the various figures, illustrate the method of the invention and semiconductor structures fabricated in accordance with the method of the invention.

FIG. 1 illustrates the steps of a method in accordance with an embodiment the invention for cleaning waste matter from the backside of a semiconductor wafer. In general, a semiconductor wafer (not shown) has a front side upon which several device features (not shown) are formed, and a backside upon which waste matter accumulates during the fabrication process. The waste matter on the backside of the wafer generally consists of several layers of different materials that were used to form the device features. For example, if the device feature is a gate with a layer of polysilicon covered by a layer of silicon nitride, then the waste matter on the backside of the wafer generally consists of a layer of polysilicon covered by a layer of silicon nitride.

The first act 10 of an embodiment of the method is to deposit a cover layer over the front side of the substrate and any device features formed on the front side in a normal coating step of a process for fabricating a component on the wafer. The cover layer is made from a material used in the process for fabricating the component, and it is deposited over the front side irrespective of whether waste matter is also removed from the backside of the wafer. The cover layer also creates a barrier over the front side of the substrate and the device features that protects the front side and the device features from being damaged while the waste matter is removed from the backside of the wafer. The cover layer is preferably deposited to a thickness that adequately forms a barrier over the front side and the device features, without increasing the thickness of the cover layer beyond that of the normal fabricating parameters of the process to form the component. The cover layer, therefore, serves the dual purposes of providing material in the normal course of a process for fabricating a component and creating a protective barrier over the front side of the substrate and the device features. In a preferred embodiment, a portion of the cover layer is subsequently formed into a permanent, functional component of the microelectronic device.

The cover layer may be made from a resist, an insulative, or a conductive material. Suitable insulative materials include silicon dioxide, silicon nitride, BPSG, TEOS, and other suitable substantially insulative materials commonly used in semiconductor processing. Suitable conductive materials include aluminum, tungsten, polysilicon, and other suitable substantially conductive materials used in semiconductor processing.

The second act 20 of an embodiment of the method illustrated in FIG. 1 is to remove the waste matter from the backside of the wafer. The removal act may be performed by etching the layers of materials from the backside of the wafer with suitable etchants selected to react with the particular layers of materials. For example, when the waste matter on the backside of the wafer has a layer of silicon nitride covering a layer of polysilicon, a first etchant is selected to remove the silicon nitride and a second etchant is selected to remove the polysilicon. Suitable etching processes and elements are well known in the semiconductor fabrication arts. Importantly, the cover layer protects the front side of the substrate and the device features on the front side from being damaged by the etchants used to remove the waste matter from the backside of the wafer.

To etch waste matter from the backside of the wafer, the wafer preferably is turned upside-down so that the cover layer rests against a support surface and the backside is exposed facing upward. The backside is then etched with a suitable etchant and for a suitable period of time to remove the waste matter from the backside of the wafer. In this embodiment, the support layer substantially prevents the etchant from contacting the cover layer to protect the cover layer and further protect the front face of the wafer. Therefore, material may be removed from the backside of the wafer with conventional etching equipment that is readily available.

In an alternative embodiment, the waste matter is removed from the backside of the wafer by planarizing the backside of the wafer with a CMP process. To CMP the waste matter from the backside of the wafer, the backside of the wafer is pressed against a chemical-mechanical planarization polishing pad in the presence of a slurry under controlled chemical, pressure, velocity, and temperature conditions. The slurry generally contains small, abrasive particles that abrade the surface of the wafer, and chemicals that etch and/or oxidize the waste matter from the backside of the wafer. The polishing pad is generally a planar pad made from a continuous phase matrix material such as polyurethane. Thus, when the pad and/or the wafer moves with respect to the other, the waste matter is removed from the surface of the wafer mechanically by the abrasive particles and chemically by the etchants and/or oxidants in the slurry. Suitable CMP processes are also well known in the semiconductor fabrication arts, one of which is disclosed in U.S. Pat. No. 5,036,015, entitled "METHOD OF END-POINT DETECTION DURING CHEMICAL/MECHANICAL PLANARIZATION OF SEMICONDUCTOR WAFERS"; which is herein incorporated by reference. The cover layer also protects the front side and the device features on the front side from being damaged by the CMP processes used to remove the waste matter from the backside of the wafer.

In a preferred embodiment of the invention, the method further includes a third step 30 in which an undesired portion of the cover layer is selectively removed in a normal removal step of the process for fabricating the component on the wafer. Importantly, the undesired portion of the cover layer is necessarily removed from the wafer in the normal course of the process for fabricating the desired component on the wafer irrespective of whether the waste matter is also remove from the wafer. Accordingly, the removal of the cover layer does not add any process steps to the normal process for fabricating the component even though waste matter is also removed from the backside of the wafer. After the undesired portion of the cover layer is removed from the wafer, only a desired portion of the cover layer remains on the wafer for use in the process of forming the component on the wafer.

In one embodiment of the third act 30, which is used when the cover layer is made from either a resist material, an insulative material, or a conductive material, the undesired portion of the cover layer is removed by etching the surface of the cover layer with a suitable etchant. One problem with etching the cover layer, however, is that etching processes do not eliminate scratches on the surface of the cover layer. In another embodiment of the inventive method, which is used when the cover layer is made from either an insulative or a conductive material, and the undesired portion of the cover layer is removed from the wafer by planarizing the cover layer with a CMP process. CMP processes remove scratches on the surface of the cover layer because they flatten the contour of a surface and produce a uniformly planar polished surface. Therefore, the undesired portion of insulative or conductive cover layers is preferably removed from the wafer by a suitable CMP process.

The third act 30 of the method illustrated in FIG. 1 preferably forms a permanent device component from a desired portion of the cover layer. To form the permanent device component, an undesired portion of the cover layer is removed from the wafer so that only a desired portion of the cover layer remains on the wafer. The desired portion of the cover layer preferably is a permanent device component that is a functional part of the particular microelectronic device being fabricated on the wafer.

The method for cleaning a semiconductor wafer illustrated in FIG. 1 is applicable to virtually any wafer structure and may be performed at several places throughout the fabrication process. An aspect of the method of the invention is to form a barrier over the front side of the substrate from a layer of material that is deposited on the front side of the wafer in a normal coating act of a process to fabricate a component of the microelectronic device. The cover layer is preferably deposited on the front side and manipulated to form a permanent, functional component of the microelectronic device irrespective of whether it is also used to protect the front side and device feature from being damaged while waste matter is removed from the backside of the wafer. Therefore, the method of the invention is applicable to any wafer structure, and at any point in the process for fabricating a wafer structure, in which a layer of material deposited in the normal course of forming a component of the microelectronic device also creates a barrier over the front side of the substrate.

FIGS. 2A–2D illustrate the operation of a method of the invention on a suitable wafer structure in which the device component formed in the normal course of depositing the cover layer is an insulating layer. Referring to FIG. 2A, a semiconductor wafer 40 has a substrate 50 with a front side 52 and a backside 54 facing away from the front side 52. The substrate 50 is generally made from silicon, and it may be doped with different impurities (not shown) at predetermined locations to form electrical components of an integrated circuit. A number of device features 60 are formed on the front side 52 of the substrate 50. In one embodiment, the device features 60 are gates made from a film stack with a layer of gate oxide 61, a layer of polysilicon 62 deposited over the gate oxide layer 61, and a layer of silicon nitride 64 deposited over the polysilicon layer 62. The gates 60 are typically formed by patterning a layer of resist material (not shown) on top of the film stack, and then etching through the film stack to the front side 52 of the substrate 50. When the device features 60 are formed, waste matter 70 often accumulates on the backside 54 of the substrate 50. More particularly, when the device features 60 are made from layers of polysilicon and silicon nitride, the waste matter 70 generally consists of a layer of polysilicon 72 covered by a layer of silicon nitride 74. After the device features 60 are formed on the front side 52 of the substrate 50, the waste matter 70 is desirably removed from the backside 54 of the substrate 50 to clean the substrate 50 and to prevent the substrate 50 from warping.

FIG. 2B illustrates an embodiment of the first act of the method for cleaning the waster matter 70 from the semiconductor wafer 40. As described above with respect to the first act 10 of the method in FIG. 1, a cover layer 80 is deposited over the front side 52 of the substrate 50 and the device features 60 formed on the front side 52. The cover layer 80 is made from an insulative material that is deposited on the wafer in a normal coating step in a process for fabricating an insulating layer over the device features 60. In operation, the insulating layer is a permanent component of the microelectronic device that provides a platform upon which additional device features (not shown) may be fabricated in subsequent process steps. More particularly, the insulating layer is formed from a desired portion 82 of the cover layer 80 by selectively removing an undesired portion 81 of the cover layer 80 from the wafer, as discussed in further detail below. The cover layer 80 also creates a barrier over the front side 52 and the device features 60 to protect the front side 52 and the device features 60 from subsequent processing steps. Accordingly, unlike conventional sacrificial resist layers that are dedicated solely to the removal of waste matter from the backside of the wafer, the cover layer 80 is deposited on the wafer in the normal course of a process for fabricating a component of the microelectronic device on the wafer.

Figure 2C:
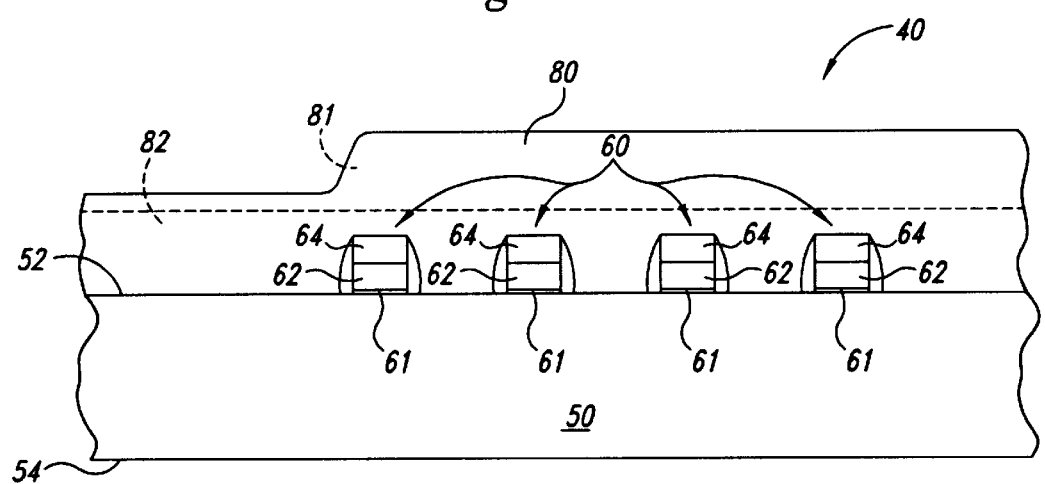
FIG. 2C is a partial schematic cross-sectional view of the semiconductor wafer structure of FIG. 2B at another point of the method of FIG. 1.
Figure 2D:
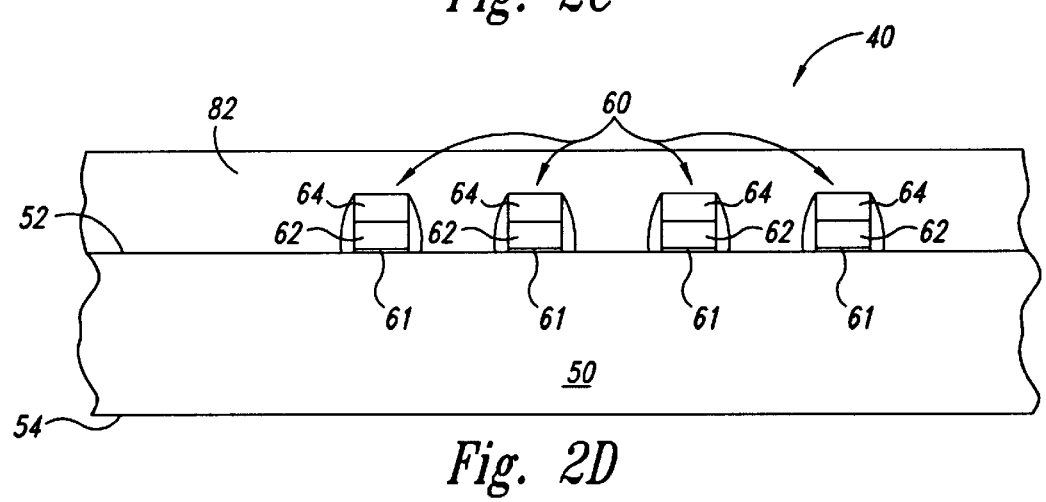
FIG. 2D is a partial schematic cross-sectional view of the semiconductor wafer structure of FIG. 2C at another point of the method of FIG. 1.

FIG. 2C illustrates the wafer 40 after the waste matter 70 (shown in FIG. 2B) has been removed from the backside 54 of the substrate 50, as described above with respect to the second act 20 of the method shown in FIG. 1. The waste matter 70 is removed from the backside 54 of the substrate 50 by a suitable etching or planarizing process. Referring to FIGS. 2B and 2C together, when the waste matter 70 has a layer made from silicon nitride and a layer made from polysilicon, the silicon nitride layer is etched with a suitable etchant reactive with silicon nitride and then the polysilicon layer is etched with a suitable etchant reactive with polysilicon. When the waste matter 70 is removed with a CMP process, however, the silicon nitride and polysilicon layers may simply be removed in a single CMP process using the same slurry.

After the waste matter 70 is removed from the backside 54 of the substrate 50, the undesired portion 81 of the cover layer 80 is preferably selectively removed from the wafer 40 in a normal procedure in the process for fabricating the insulating layer. The desired portion 82 of the cover layer 80 accordingly remains on the wafer 40 and forms an insulating layer of the microelectronic device. In accordance with the third act 30 of the method described above with respect to FIG. 1, FIG. 2D illustrates the wafer 40 after the undesired portion 81 (shown in FIG. 2C) of the cover layer 80 has been selectively removed from the wafer to leave a uniformly planar insulating layer made from the desired portion 82 of the cover layer 80. The insulating layer is preferably a permanent, functional component of the microelectronic device that is formed by planarizing the undesired portion 81 of the cover layer 80 from the wafer 40 with a suitable CMP process.

Figure 3A:
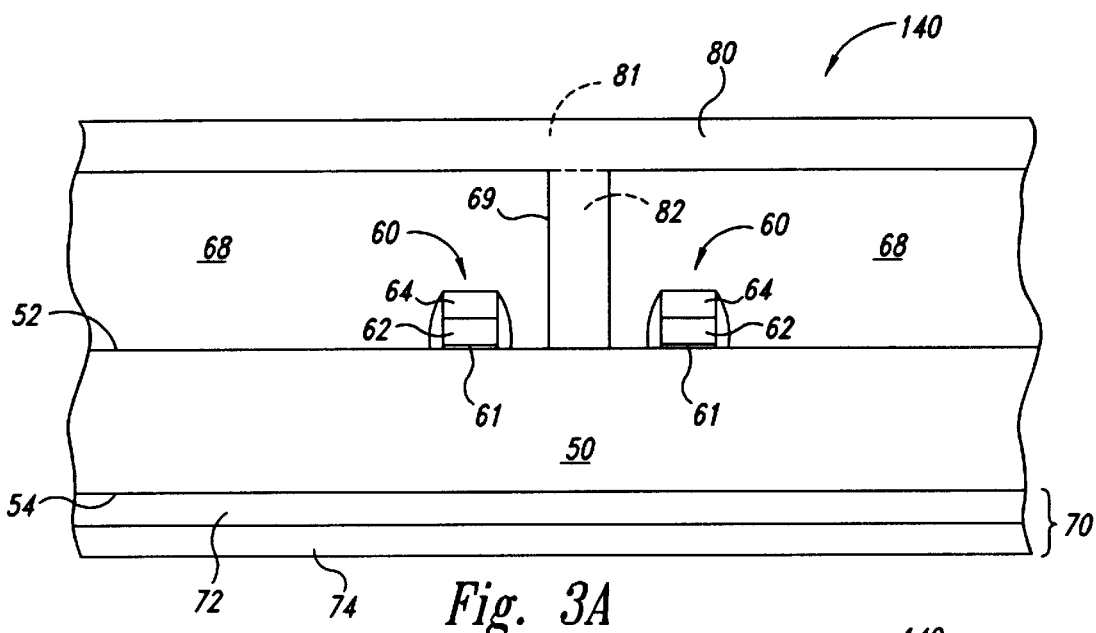
FIG. 3A is a partial schematic cross-sectional view of another semiconductor wafer structure at one point of the method of FIG. 1.
Figure 3B:
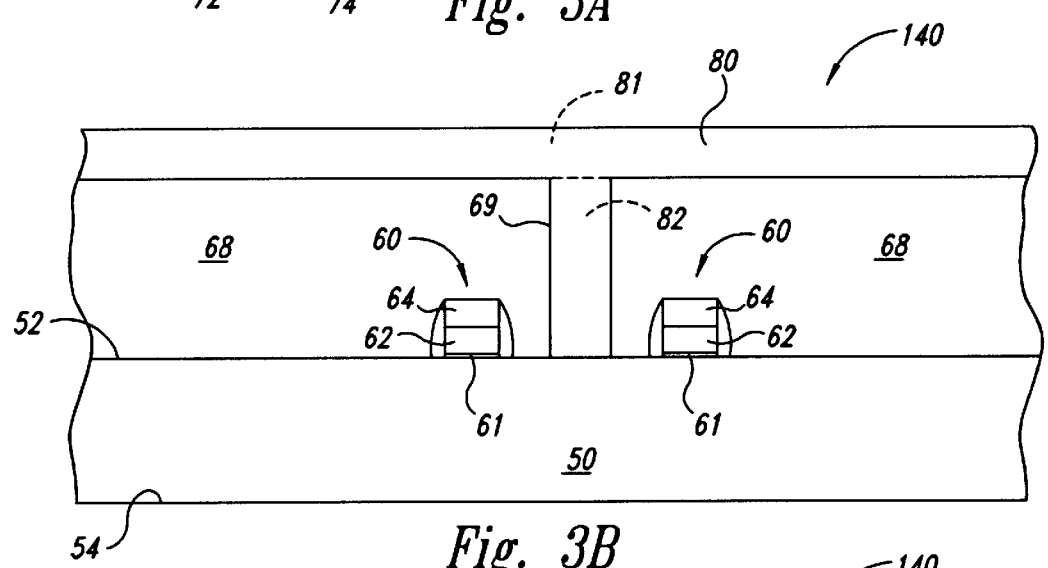
FIG. 3B is a partial schematic cross-sectional view of the semiconductor wafer structure of FIG. 3A at another point of the method of FIG. 1.
Figure 3C:
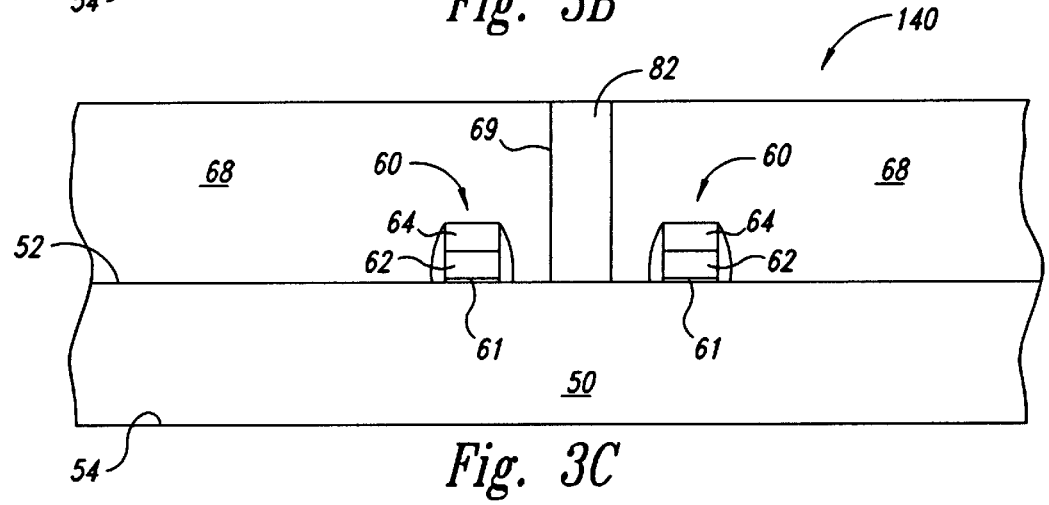
FIG. 3C is a partial schematic cross-sectional view of the semiconductor wafer structure of FIG. 3B at another point of the method of FIG. 1.

FIGS. 3A–3C illustrate the operation of the method of the invention on another suitable wafer structure 140. Referring to FIG. 3A, a number of device features 60 are formed on the front side 52 of the substrate 50. As with the wafer structure 40 shown in FIG. 2A, the waste matter 70 accumulates on the backside 54 of the substrate 50 during the fabrication of the device features 60. Unlike the wafer structure 40 shown in FIG. 2A, however, an insulating layer 68 is formed over the front side 52 and the device features 60, and a via 69 is etched through the insulating layer 68 to the front side 52 of the substrate 50. In the wafer structure 140, the cover layer 80 is made from a substantially conductive material that is deposited over the top of the insulating layer 68 and into the via 69. The desired portion 82 of the cover layer 80 is the portion of conductive material positioned in the via 69, and the undesired portion 81 of the cover layer 80 is the portion of conductive material positioned above the top of the insulative layer 68. The cover layer 80 of the wafer 140 may be made from polysilicon, aluminum, tungsten, or any other suitable conductive material.

FIG. 3B illustrates the wafer 140 after the waste material 70 (shown in FIG. 3A) has been removed from the backside 54 of the substrate 50, as discussed above with respect to the second act 20 of the method shown in FIG. 1. Again, the waste matter 70 is removed from the backside 54 of the substrate 50 by a suitable etching or planarizing process. Importantly, the conductive cover layer 80 forms a barrier to protect the insulating layer 68, the device components 60, and the front side 52 while the waste matter 70 is removed from the substrate 50.

In accordance with the third act 30 of the method described above with respect to FIG. 1, FIG. 3C illustrates the wafer 140 after the undesired portion 81 (shown in FIG. 3B) of the cover layer 80 has been selectively removed in a normal removal step in the process for fabricating an electrically conductive component of the microelectronic device. The electrically conductive component formed from the desired portion 82 of the cover layer 80 may be an interconnect or plug between the front side 52 of the substrate 50 and the top of the insulating layer 68. Additional devices (not shown) are accordingly connected to the interconnect 82 to form additional components in the integrated circuit. Thus, in the case of forming an electrically conductive element, the desired portion 82 of the cover layer 80 forms a permanent, functional device component of the microelectronic device.

Figure 4A:
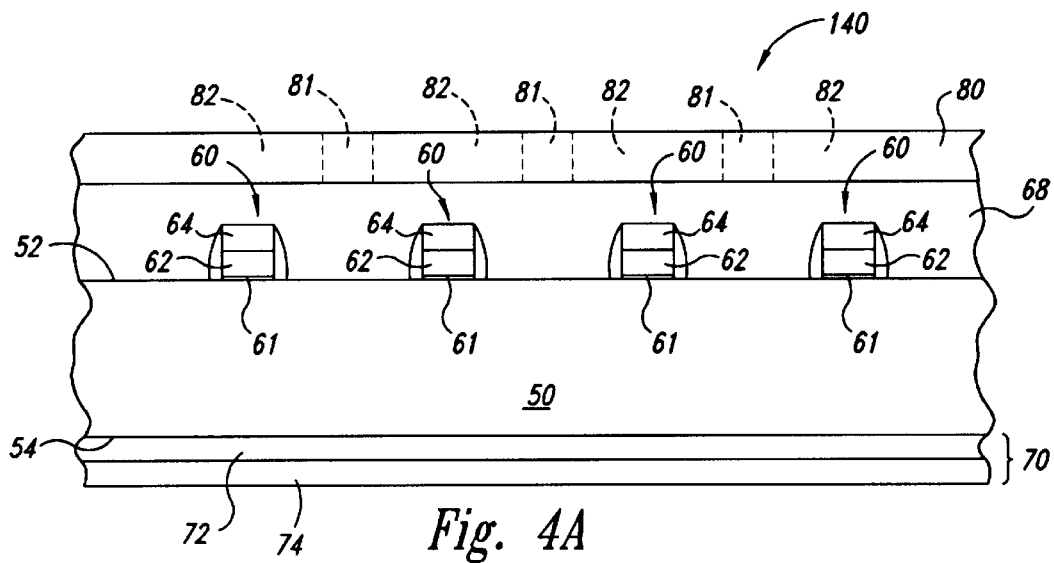
FIG. 4A is a partial schematic cross-sectional view of another semiconductor wafer structure at one point of the method of FIG. 1.
Figure 4B:
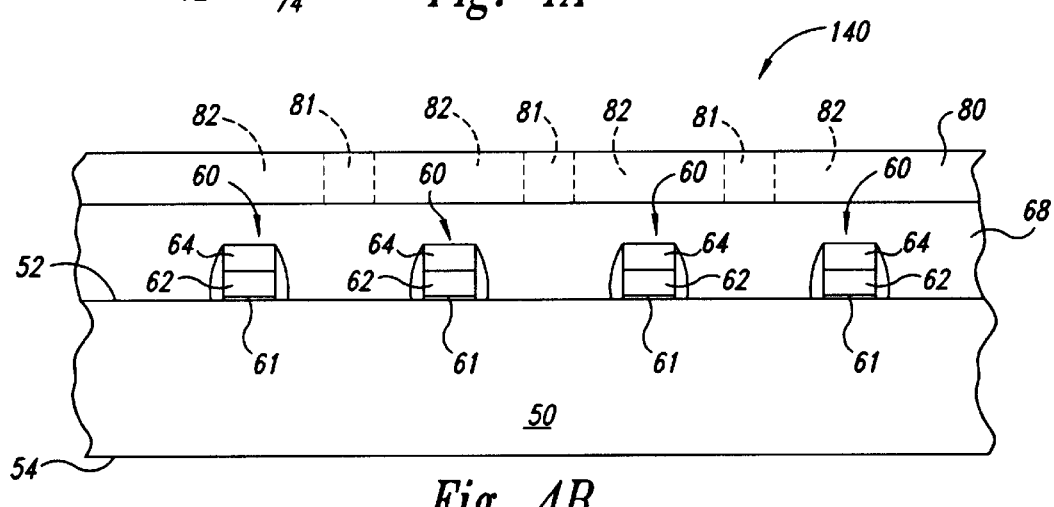
FIG. 4B is a partial schematic cross-sectional view of the semiconductor wafer structure of FIG. 4A at another point of the method of FIG. 1.
Figure 4C:
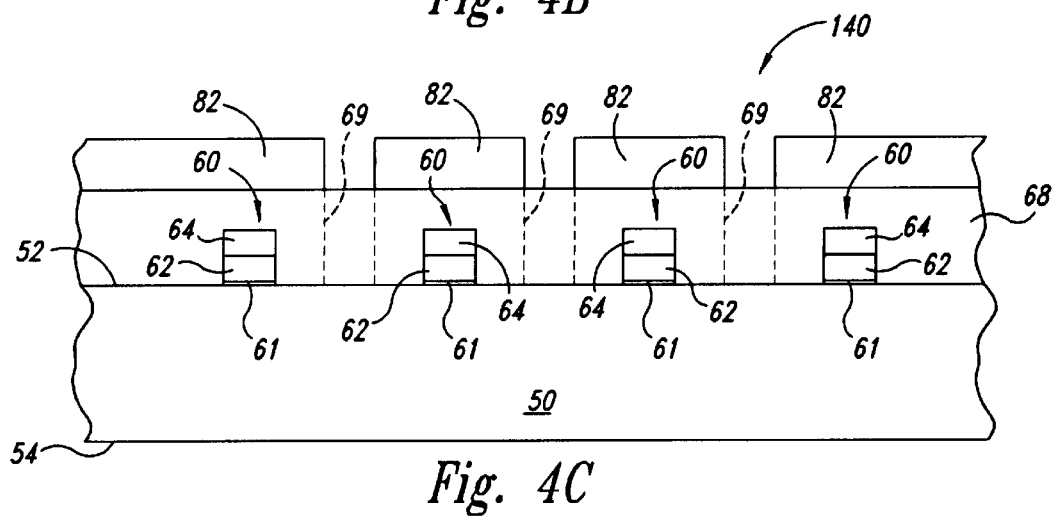
FIG. 4C is a partial schematic cross-sectional view of the semiconductor wafer structure of FIG. 4B at another point of the method of FIG. 1.

FIGS. 4A–4C illustrate the operation of the method of the invention on the wafer structure 140 at an earlier point in the process for fabricating the electrically conductive element. Referring to FIG. 4A, the device features 60 are formed on the front side 52 of the substrate 50, and the waste matter 70 accumulates on the backside 54 of the substrate 50 during the fabrication of the device features 60. The insulating layer 68 is deposited over the front side 52, but the via 69 (shown in FIG. 3C) is not yet etched through the insulating layer 68. In the wafer structure 140 shown in FIG. 4A, the cover layer 80 is made from a resist material that is deposited over the top of the insulating layer 68. The desired portion 82 of the cover layer 80 is the portion of resist material positioned over the permanent portion of the insulating layer 68, and the undesired portion 81 of the cover layer 80 is the portion of the resist material positioned between the device features 60 where the vias are to be formed.

FIG. 4B illustrates the wafer 140 after the waste material 70 (shown in FIG. 4A) has been removed from the backside 54 of the substrate 50, as discussed above with respect to the second step 20 of the method of FIG. 1. Importantly, the resist cover layer 80 forms a barrier to protect the insulating layer 68, the device components 60, and the front side 52 of the wafer while the waste matter 70 is removed from the substrate 50.

In accordance with the third act 30 of the method described above with respect to FIG. 1, FIG. 4C illustrates the wafer 140 after the undesired portion 81 (shown in FIG. 4B) of the cover layer 80 has been selectively removed in a normal step in the process for etching a number of vias 69 (shown in phantom) through the insulating layer 68. After the vias 69 are etched through the insulating layer 68, the desired portions 82 of the resist material are washed from the wafer so that the conductive material may be deposited on top of the insulating layer 68 and into the via 69.

It will be appreciated that the resist cover layer 80 is deposited onto and removed from the wafer 140 irrespective of whether it is also used to protect the front side 52 of the substrate 50 while the waste matter 70 is removed from the backside 54 of the substrate 50. Thus, unlike conventional waste matter removal methods that use a sacrificial resist layer dedicated solely to removing the waste matter from the backside of the wafer, the cover layer 80 of resist material of the invention is deposited over the front side 52 and the device features 60 to provide material used in a normal coating step of a process for forming a component of the microelectronic device. The method of the invention, therefore, is not limited to the cover layers 80 shown in FIGS. 2A–3C in which the material of the cover layer 80 itself forms a permanent, functional device component of the microelectronic device.

One advantage of several embodiments of methods are that they increase the throughput of finished microelectronic devices in which waste matter is cleaned from the backside of the substrate. Compared to conventional waste matter removal methods, the present invention reduces the number of process steps by forming a protective barrier over the front side from a layer of material that is deposited on the wafer in a normal coating step of a process for fabricating a component on the wafer. In a preferred embodiment, a portion of the cover layer remains on the wafer to form a permanent, functional component of the microelectronic device. For example, the cover layer is deposited on the wafer irrespective of whether it is also used to protect the front side of this wafer while the waste matter is removed from the backside of the wafer. The deposition and removal steps of the cover layer, therefore, are not otherwise additional steps in the normal course of the fabrication of the microelectronic device.

Another advantage of several embodiments of the invention is that they reduce the waste of resist material conventionally required to clean waste matter from the backside of the substrate. In conventional methods for cleaning waste matter from the backside of a semiconductor substrate, the sacrificial layer of resist material is used only to protect the front side of the wafer, and then it is completely removed from the wafer. The entire amount of the resist material, accordingly, is an additional cost in producing the microelectronic devices. The preferred embodiments of the invention eliminate the need to use additional resist material to protect the front side of the substrate because the cover layer is deposited over the front side irrespective of whether it is also used as a protective barrier. Thus, the present invention does not require any additional material than would otherwise be used to form the component of the microelectronic device.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. In the manufacturing of semiconductor devices on a wafer having a front side and a backside, a method of fabricating a component on the front side of the wafer, comprising:

cleaning the backside by forming a barrier layer on the front side and then removing matter from the backside; and fabricating components on the front side after removing the matter from the backside by using at least a portion of the barrier layer in the fabrication of the components.

2. The method of claim 1 wherein cleaning the backside comprises etching matter from the backside with an etching process other than chemical-mechanical planarization.

3. The method of claim 1 wherein cleaning the backside comprises chemical-mechanical planarization of the backside.

4. The method of claim 1 wherein a portion of the barrier is a permanent element of the wafer.

5. The method of claim 1 wherein forming the barrier layer comprises depositing a layer of insulative material on the front side of the wafer.

6. The method of claim 1 wherein forming the barrier layer comprises depositing a layer of conductive material on the front side of the wafer.

7. In the manufacturing of semiconductor devices on a wafer having a front side and a backside, a method of fabricating a component on the front side of the wafer, comprising:

depositing a cover layer on the front side;

cleaning the backside, the cover layer protecting the front side and any devices formed on the front side; and fabricating components on the front side after cleaning the backside using at least a portion of the cover layer in the fabrication of the components.

8. The method of claim 7 wherein cleaning the backside comprises etching matter from the backside with an etching process other than chemical-mechanical planarization.

9. The method of claim 7 wherein cleaning the backside comprises chemical-mechanical planarization of the backside.

10. The method of claim 7 wherein a portion of the cover layer is a permanent element of the wafer.

11. The method of claim 7 wherein depositing the cover layer comprises depositing a layer of insulative material on the front side of the wafer.

12. The method of claim 7 wherein depositing the cover layer comprises depositing a layer of conductive material on the front side of the wafer.

13. In the manufacturing of semiconductor devices on a wafer having a front side and a backside, a method of fabricating a component on the front side of the wafer, comprising:

forming a non-sacrificial layer on the front side;

cleaning the backside, the non-sacrificial layer protecting the front side and any devices formed on the front side; and fabricating components on the front side after cleaning the backside using at least a portion of the non-sacrificial layer in the fabrication of the components.

14. The method of claim 13 wherein cleaning the backside comprises etching matter from the backside with an etching process other than chemical-mechanical planarization.

15. The method of claim 13 wherein cleaning the backside comprises chemical-mechanical planarization of the backside.

16. The method of claim 13 wherein a portion of the non-sacrificial layer is a permanent element of the wafer.

17. The method of claim 13 wherein forming the non-sacrificial layer comprises depositing a layer of insulative material on the front side of the wafer.

18. The method of claim 13 wherein forming the non-sacrificial layer comprises depositing a layer of conductive material on the front side of the wafer.

* * * * *